United States Patent
Kwon

(10) Patent No.: US 10,189,369 B2
(45) Date of Patent: Jan. 29, 2019

(54) METHOD AND SYSTEM FOR CONTROLLING MOTORS

(71) Applicants: HYUNDAI MOTOR COMPANY, Seoul (KR); KIA MOTORS CORPORATION, Seoul (KR)

(72) Inventor: Mun Soon Kwon, Hwaseong-si (KR)

(73) Assignees: HYUNDAI MOTOR COMPANY, Seoul (KR); KIA MOTORS CORPORATION, Seoul (KR)

( * ) Notice: Subject to any disclaimer, the term of this patent is extended or adjusted under 35 U.S.C. 154(b) by 2 days.

(21) Appl. No.: 15/608,211

(22) Filed: May 30, 2017

(65) Prior Publication Data

US 2018/0147952 A1 May 31, 2018

(30) Foreign Application Priority Data

Nov. 25, 2016 (KR) .......................... 10-2016-0157895

(51) Int. Cl.
*B60L 11/18* (2006.01)
*B60W 10/26* (2006.01)
(Continued)

(52) U.S. Cl.
CPC .......... *B60L 11/1862* (2013.01); *B60L 1/003* (2013.01); *B60L 11/1861* (2013.01);
(Continued)

(58) Field of Classification Search
CPC ... B60L 11/1862; G01R 31/361; B60W 10/26
(Continued)

(56) References Cited

U.S. PATENT DOCUMENTS

| 5,347,224 | A | * | 9/1994 | Brokaw | .................. G01R 19/32 |
| | | | | | 324/126 |
| 2013/0165293 | A1 | * | 6/2013 | Shinohara et al. | ...... B60K 1/02 |
| | | | | | 477/3 |

(Continued)

FOREIGN PATENT DOCUMENTS

KR 10-2013-0068857 A 6/2013
KR 10-2014-0090848 A 7/2014
(Continued)

OTHER PUBLICATIONS

Office Action dated Aug. 31, 2018 from the corresponding Korean Application No. 10-2016-0157895, 6 pp.

*Primary Examiner* — Sun Lin
(74) *Attorney, Agent, or Firm* — Brinks Gilson & Lione

(57) ABSTRACT

A method and a system for controlling motors is provided to have a vehicle travel smoothly in such a manner that, when a state of charge of a battery for supplying electric power stored to a plurality of motors included in the vehicle is low, a consumption of the battery is reduced by decreasing the electric power supplied to each motor of the plurality of motors. The method of controlling motors includes: determining a state of charge of a battery storing electric power supplied to each motor of a plurality of motors; calculating a present current consumption of each motor of the plurality of motors when the state of charge of the battery is equal to or less than a predetermined reference value; and resetting a power supply to each motor of the plurality of motors, based on the present current consumption of each motor of the plurality of motors.

15 Claims, 3 Drawing Sheets

(51) Int. Cl.
*G01R 31/36* (2006.01)
*B60L 1/00* (2006.01)

(52) U.S. Cl.
CPC ........... B60W 10/26 (2013.01); G01R 31/361 (2013.01); *B60L 2240/36* (2013.01); *B60L 2240/445* (2013.01); *B60L 2240/54* (2013.01)

(58) Field of Classification Search
USPC ....................................................... 320/134
See application file for complete search history.

(56) References Cited

U.S. PATENT DOCUMENTS

| | | | |
|---|---|---|---|
| 2014/0316728 A1* | 10/2014 | Zhong et al. | G01R 31/3651 702/63 |
| 2015/0014081 A1* | 1/2015 | Noguchi | B60K 6/52 180/243 |
| 2015/0210232 A1* | 7/2015 | Kanzaki et al. | B60R 16/033 701/36 |
| 2016/0238667 A1* | 8/2016 | Palmisano et al. | B60R 16/023 |
| 2016/0318501 A1* | 11/2016 | Oldridge | B60L 15/2045 |

FOREIGN PATENT DOCUMENTS

| | | |
|---|---|---|
| KR | 10-2016-0035750 A | 4/2016 |
| KR | 10-2016-0044991 A | 4/2016 |
| KR | 10-1617581 B1 | 5/2016 |

\* cited by examiner

METHOD AND SYSTEM FOR CONTROLLING MOTORS

CROSS REFERENCE TO RELATED APPLICATION

The present application claims priority to and the benefit of Korean Patent Application No. 10-2016-0157895, filed on Nov. 25, 2016, the entire contents of which is incorporated herein by reference.

FIELD

The present disclosure relates to a method and system for controlling motors, and, more particularly, to a method and system for controlling motors, capable of keeping a vehicle smoothly traveling.

BACKGROUND

The statements in this section merely provide background information related to the present disclosure and may not constitute prior art.

In general, vehicles include different types of motors to realize a variety of functions required for the driving thereof. For example, a vehicle using an internal combustion engine includes a motor which drives a cooling fan used to cool coolant for cooling the engine, or a motor which drives an AAF (Active Air Flap) for regulating an inflow of air. In addition, in an electric vehicle or a hybrid vehicle which is driven by driving power generated using a drive motor, a motor is applied to an EWP (Electric Water Pump) which circulates coolant for cooling high-heating power electric parts adopted in a power conversion system for supplying electric power to the drive motor.

In order to drive these motors, the vehicle includes a battery which stores electric energy and supplies the stored electric energy, i.e. the driving power, to the motors for the driving thereof. The battery needs to be always maintained in a charged state over a certain level in order for the vehicle to smoothly travel.

However, the electric power stored in the battery may be decreased below a desired level due to various causes when the vehicle is actually maintained and travels. In particular, when the electric power stored in the battery is decreased during the traveling of the vehicle, it is desired to immediately charge the battery and at the same time to reduce an amount of electric power discharged from the battery in order to prevent deterioration of the battery or shutdown of the vehicle due to additional discharge.

The various motors included in the vehicle have a large influence on the consumption of electric power stored in the battery. Therefore, when the electric power of the battery is decreased below a desired level, it is desired to reduce electric power consumed by the motors. However, we have discovered that when the operation of the motors is stopped or the power consumption of each of the motors is reduced without special considerations while the vehicle is actually traveling, a variety of functions (e.g. cooling of a vehicle engine and power electric parts) realized by driving the motors are deteriorated, which in severe cases may lead to an adverse influence on the engine or the drive motor.

Accordingly, when the electric power stored in the battery is decreased below a certain level during the traveling of the vehicle, the power consumption of the battery must be reduced in consideration of various factors desired for the traveling of the vehicle.

The foregoing is intended merely to aid in the understanding of the background of the present disclosure, and is not intended to mean that the present disclosure falls within the purview of the related art that is already known to those skilled in the art.

SUMMARY

The present disclosure provides a method and system for controlling motors, capable of keeping a vehicle smoothly traveling in such a manner that, when the state of charge of a battery for supplying electric power stored therein to a plurality of motors included in the vehicle is low, the consumption of the battery is reduced by decreasing the electric power supplied to each of the motors.

In one form of the present disclosure, a method of controlling a plurality of motors provided in a vehicle includes steps of: determining, by a controller, a state of charge of a battery configured to store a power supplied to each motor of a plurality of motors; calculating, by the controller, a present current consumption of each motor of the plurality motors when the state of charge of the battery is equal to or less than a predetermined reference value; and resetting, by the controller, a power supply to each motor of the plurality of motors based on the present current consumption of each motor of the plurality of motors.

The calculating the present current consumption may include setting a first priority for power supply between the plurality of motors, based on the present current consumption of each motor of the plurality of motors.

The step of resetting the power supply further includes a step of assigning less power supply to a motor of which the present current consumption is less than the present current consumption of other motors of the plurality of motors.

An electric power may be supplied to each of the motors by applying a driving voltage by a PWM method in which a duty is adjusted.

The calculating a present current consumption may further include setting a second priority, based on a rating of each of the motors, after the setting the first priority.

The step of resetting the power supply further includes a step of calculating an integrated priority based on the first and second priorities of each motor of the plurality of motors and comparing the integrated priorities, wherein a greater reduction rate of power is applied to a corresponding motor of which the integrated priority is lower than the integrated priority of other motors.

In the resetting a supply power, when motors having the same integrated priority exist, a greater reduction rate of power is applied to a motor of which the first priority is low.

Each of the first and second priorities may be set such that priority values of 1 to n (n being a natural number corresponding to the number of motors) are assigned from a motor having the highest priority in sequential order, and in the resetting the power supply, based on a result obtained by combining priority values according to the first priority and priority values according to the second priority, a greater reduction rate of power is applied to a corresponding motor of which a combined priority value is greater than a combined value of other motors.

In the resetting a supply power, when a same combined priority value is found in different motors, a greater reduction rate of power is applied to a motor of which the priority value of the first priority is greater than the priority value of the first priority assigned to other motors.

In accordance with another aspect of the present disclosure, a system for controlling motors includes a battery, a plurality of motors driven by an electric power stored in the battery, and a controller configured to control a driving voltage applied to each of the motors by a PWM method in which a duty is adjusted, wherein when a state of charge of the battery is equal to or less than a predetermined reference value, the controller is configured to calculate a present current consumption of each of the motors, and resets a supply power to each of the motors, based on the present current consumption of each of the motors.

The controller may set a first priority for power supply between the motors, based on the present current consumption of each of the motors, and less power supply is assigned by the controller to a motor of which the present current consumption is less than the present current consumption of other motors.

The controller may set a second priority based on a rating of each of the motors, and the controller is configured to calculate an integrated priority based on the first and second priorities and compare the integrated priorities, wherein a greater reduction rate of power supply is applied by the controller to a corresponding motor of which the integrated priority is lower than the integrated priority of other motors.

When motors having the same integrated priority exist, a greater reduction rate of power supply is applied by the controller to a motor of which the first priority is low.

Each of the first and second priorities may be set such that priority values of 1 to n (n being a natural number corresponding to the number of motors) are assigned from a motor having the highest priority in sequential order by the controller, and the controller is configured to combine priority values according to the first priority and priority values according to the second priority, and apply a greater reduction rate of power supply to a corresponding motor of which a combined priority value is greater than a combined value of other motors.

When a same combined priority value is found in different motors, the controller is configured to apply a greater reduction rate of power supply to a corresponding motor of which the priority value of the first priority is greater than the priority value of the first priority assigned to other motors.

As apparent from the above description, the method and system for controlling motors can actively control the driving of motors considering the traveling state of a vehicle and an effect on power consumption of each of the motors when it is desired to reduce the power consumption of the motor due to the low state of charge of a battery.

Therefore, the method and system for controlling motors can inhibit or prevent the shutdown of the vehicle due to the over-discharge of the battery by reducing the consumption of the battery while having a reduced influence on the traveling of the vehicle even though the state of charge of the battery is decreased, and can inhibit or prevent an engine or power electric parts from being damaged due to the insufficient driving of the motors and thus deterioration of cooling performance of the vehicle.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

Figure 1:
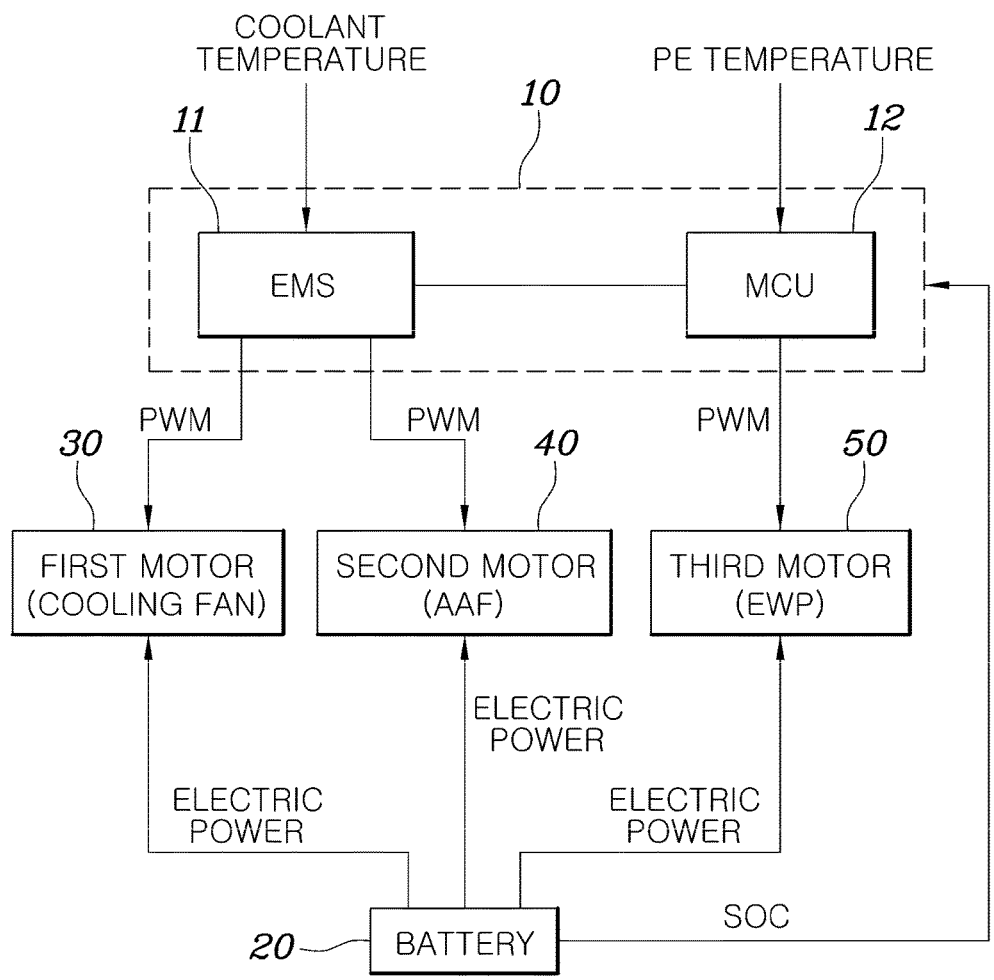
FIG. 1 is a block diagram illustrating a system for controlling motors in one form of the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

A method and system for controlling motors in forms of the present disclosure will be described below with reference to the accompanying drawings.

FIG. 1 is a block diagram illustrating a system for controlling motors in one form of the present disclosure.

As illustrated in FIG. 1, the system for controlling motors may include a battery 20 which stores electric energy, a plurality of motors 30, 40, and 50 which are driven by the electric power supplied from the battery 20, and a controller 10 which allows the electric power stored in the battery 20 to be supplied to the motors 30, 40, and 50.

The battery 20 is a component provided to store electric energy, and may be used as a power supply for a variety of electronic parts included in a vehicle as well as the motors 30, 40, and 50 illustrated in FIG. 1.

The motors 30, 40, and 50 are some of the electronic parts of the vehicle, and may include a motor 30 which rotates a cooling fan of a radiator of the vehicle, a motor 40 which drives an AAF (Active Air Flap), and a motor 50 which is provided in an EWP (Electric Water Pump) for circulating coolant.

The controller 10 is a unit for controlling the driving power supplied from the battery 20 to the motors 30, 40, and 50. FIG. 1 illustrates that the controller 10 includes an EMS (Engine Management System) 11 which controls the motor 30 provided in the cooling fan and the motor 40 provided in the AAF and an MCU (Motor Control Unit) 12 which controls the motor 50 provided in the EWP. However, these components are some of the components of the controller 10, and the present disclosure is not limited thereto. The present disclosure may be embodied in different forms without departing from the scope and spirit of the present disclosure.

As illustrated in FIG. 1, the EMS 11 may control the motor 30 provided in the cooling fan and the motor 40 provided in the AAF, which are components relating to the cooling of an engine, and the MCU 12 may control the motor 50 provided in the EWP which is used to circulate coolant for cooling of a PE (Power Electric) part used to actuate a drive motor used for driving of an electric vehicle or a hybrid vehicle.

In the form illustrated in FIG. 1, the motors may be controlled by cooperation control of the EMS 11 and the MCU 12 which are two components of the controller.

Particularly, the controller 10 may control the motors 30, 40, and 50 such that a driving voltage is applied to each of the motors by a PWM (Pulse Width Modulation) method in which a duty is adjusted. Typically, a motor may be controlled by a PWM method or using CAN (Controller Area Network) communication. In the form of the present disclosure, the motors are controlled by the PWM method in order to resolve the disadvantages of the CAN communication (a limitation on the number of controllers to inhibit or prevent the delay and failure of communication and a high cost desired to realize it) and easily calculate the power consumptions of the motors.

In more detail, the controller 10 may determine an SOC (State Of Charge) of the battery 20 and reset driving powers supplied to the motors 30, 40, and 50 when the SOC of the battery 20 is equal to or less than a predetermined reference value. The controller 10 may reset the driving powers applied to the motors 30, 40, and 50 by controlling the PWM duties of the driving powers.

For example, when the SOC of the battery 20 is equal to or less than the reference value, the controller 10 may reduce the driving powers applied to the motors 30, 40, and 50 to reduce a discharge amount of the battery 20 and may reduce the PWM duties of the driving powers applied to the motors 30, 40, and 50 so as to delay a discharge rate of the battery 20. In the process of reducing the PWM duties of the driving powers applied to the motors 30, 40, and 50, the controller 10 controls the driving powers of the motors 30, 40, and 50 at different reduction rates for each of the motors, in view of the traveling condition of the vehicle and the effect on battery consumption by the motors, rather than at the same reduction rate for all motors.

Hereinafter, a method of controlling motors will be described in detail in order to help understanding of the operation and effect of the system for controlling motors having the above configuration according to the form of the present disclosure.

Figure 2:
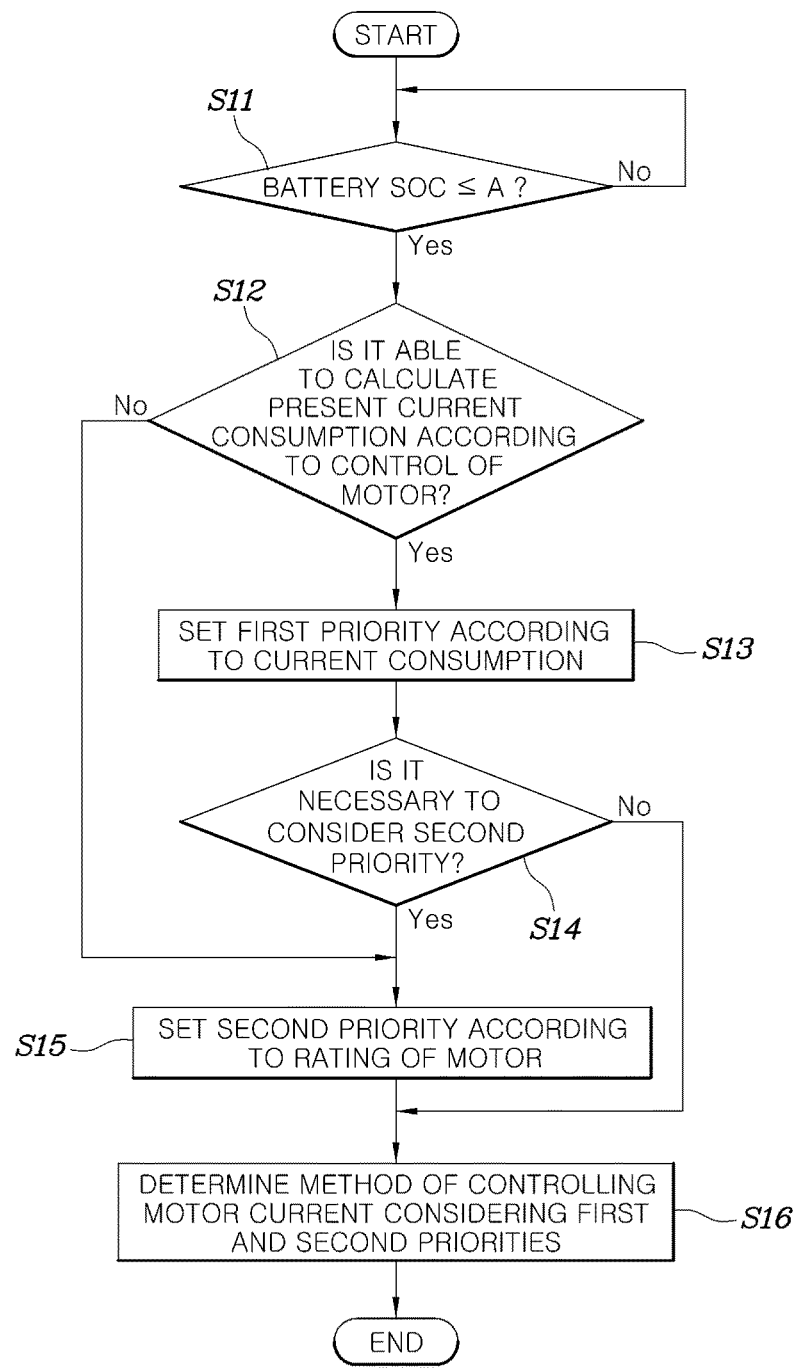
FIG. 2 is a flowchart illustrating a method of controlling motors in another form of the present disclosure.

FIG. 2 is a flowchart illustrating a method of controlling motors in one form of the present disclosure. In the present form, the same reference numbers will be used to refer to the same or like parts of the above form.

First, the controller 10 determines whether the SOC of the battery 20 is equal to or less than a predetermined reference value A (S11). FIG. 1 illustrates that the controller 10 determines the SOC of the battery 20 by the voltage directly supplied therefrom. However, the controller 10 may receive information on the SOC of the battery or be informed that the SOC of the battery is equal to or less than a predetermined reference value A, from a BMS (Battery Management System) which is a separate controller provided to manage the battery 20.

Next, the controller 10 may calculate an amount of current which is currently consumed in each of the motors 30, 40, and 50, i.e. a r thereof (S12 and S13). Since the controller 10 controls the motors 30, 40, and 50 according to the traveling state of the vehicle, e.g. the temperature of engine coolant or the temperature of the PE part, the present current consumptions of the motors 30, 40, and 50 may reflect the current traveling state of the vehicle.

Since the motors 30, 40, and 50 are driven through PWM control as described above, the controller 10 may easily calculate the current consumptions considering a current magnitude during an on-duty and a time for maintaining the on-duty in the PWM control.

Figure 3A:
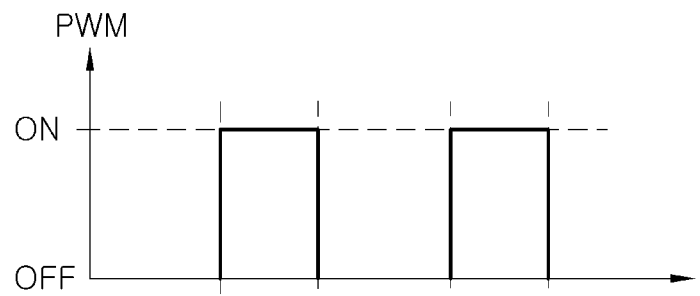
FIGS. 3A-3C are views for explaining a concept of calculating current consumptions of motors in the method and system for controlling motors in one form of the present disclosure.
Figure 3B:
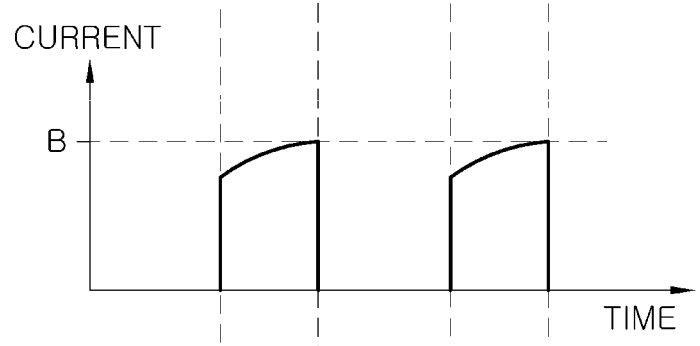
Figure 3C:
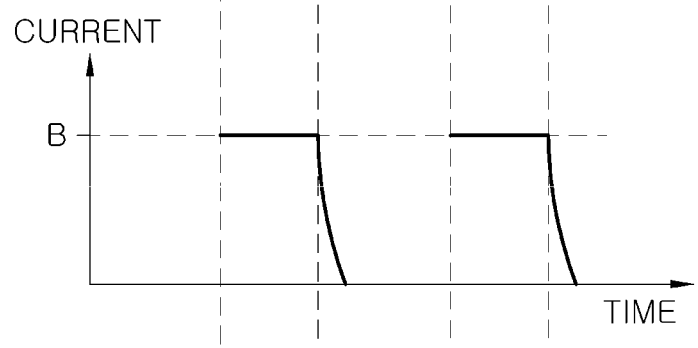

FIGS. 3A-3C are views for explaining a concept of calculating current consumptions of motors in the method and system for controlling motors in the form of the present disclosure.

As illustrated in FIG. 3A, the signal for controlling each of the motors 30, 40, and 50 may be applied as a square wave having an on/off duty by the control of the controller 10. A current is applied to each of the motors 30, 40, and 50 in response to the PWM control signal. As in FIG. 3B, the current may increase gently rather than instantly during the on-duty. As in FIG. 3C, the current may decrease gently by a regenerative component when the off-duty is initiated.

The driving current of each of the motors 30, 40, and 50 has a certain pattern corresponding to the on/off state of the PWM control signal. The current decreased gently during the off-duty may compensate for the current increased gently during the on-duty. Therefore, as illustrated in FIG. 3C, the current consumption per one cycle of the PWM control signal may be calculated by multiplying a duration time of the on-duty and a maximum current value at the on-duty.

When it is determined that the controller 10 is able to calculate the present current consumptions of the motors 30, 40, and 50 in step S12, the controller 10 may calculate the present current consumptions of the respective motors 30, 40, and 50 using the above method described with reference to FIGS. 3A-3C and may set a first priority in the order that the present current consumptions are high in step S13.

Next, when it is determined that the controller 10 is able to reset the power supply to the motors 30, 40, and 50 using only the first priority (S14), the controller 10 may reset the power supply to the motors 30, 40, and 50 using the first priority (S16).

For example, in step S16, when the motor 30 provided in the cooling fan has the first highest priority, the motor 50 provided in the EWP has the first intermediate priority, and the motor 40 provided in the AAF has the first lowest priority, the controller 10 determines that the driving of the motor 30 provided in the cooling fan is desired most of all in the traveling of the vehicle. Thus, the controller 10 may allow the present current consumption of the motor 30 provided in the cooling fan to be maintained (there is no reduction in driving power), allow the driving power of the motor 50 provided in the EWP to be reduced to a current 70% level, and allow the driving power of the motor 40 provided in the AAF to be reduced to a current 50% level.

The reduction rate of driving power according to the first priority may be preset, and may be variously changed depending on the traveling environment or durable state of the vehicle.

Meanwhile, when it is determined that the controller 10 is unable to calculate the present current consumptions of the motors 30, 40, and 50 for setting the first priority in step S12, or when it is determined that it is desired to consider a second priority (there is a little difference between the present current consumptions of the motors 30, 40, and 50) in step S14, the controller 10 may set a second priority.

The second priority may be set considering an effect on current consumption of the vehicle by the motors 30, 40, and 50 in step S15, and the controller 10 may set the second priority according to the ratings of the motors 30, 40, and 50. For example, when it is desired to reduce the consumption of the battery 20 as low as possible due to the low state of charge of the battery 20, the controller 10 may set the second priority in the order that the rated power consumptions of the motors 30, 40, and 50 are low in step S15.

When both of the first and second priorities are set, the controller 10 may set a final integrated priority considering the first and second priorities together in step S16.

In order to set the final priority, the controller 10 may set each of the first and second priorities such that priority values of 1 to n (n being a natural number corresponding to the number of a plurality of motors) are assigned from a motor having the highest priority in sequential order. Next, the controller 10 may set the final integrated priority by adding priority values according to the first priority and priority values according to the second priority. Here, the integrated priority is set such that the motor having the added lowest priority has the highest priority.

In the order that the integrated priority is high (the added priority values are low), the reduction rate of power supplied to a corresponding motor may be set to be larger by the controller 10.

Meanwhile, in step S16, when there are the motors having the same integrated priority, the controller 10 may determine the reduction rate of power supplied to each of the motors 30, 40, and 50, based on the first priority. That is, when the result obtained by adding priority values according to the first priority and priority values according to the second priority is the same, the higher the priority values according to the first priority (the lower the priority), the reduction rate of power supplied to a corresponding motor may be set to be larger by the controller 10.

Next, the controller 10 may reduce the power consumptions of the motors 30, 40, and 50 by reflecting the reduction rate of power determined in step S16 and changing the duty of the PWM signal for controlling each of the motors 30, 40, and 50.

As described above, the method and system for controlling motors in the forms of the present disclosure can actively control the driving of the motors considering the traveling state of the vehicle and the effect on power consumption of each of the motors when it is desired to reduce the power consumption of the motor due to the low state of charge of the battery.

Therefore, the method and system for controlling motors can reduce or prevent the shutdown of the vehicle due to the over-discharge of the battery by reducing the consumption of the battery while having a reduced influence on the traveling of the vehicle even though the state of charge of the battery is decreased, and can reduce or prevent the engine or the power electric parts from being damaged due to the insufficient driving of the motors and thus deterioration of cooling performance of the vehicle.

Although the forms of the present disclosure have been disclosed for illustrative purposes, those skilled in the art will appreciate that various modifications, additions and substitutions are possible, without departing from the scope and spirit of the present disclosure.

What is claimed is:

1. A method of controlling a plurality of motors provided in a vehicle, the method comprising:
   determining, by a controller, a state of charge of a battery configured to store a power supplied to each motor of the plurality of motors;
   calculating, by the controller, a present current consumption of each motor of the plurality of motors when the state of charge of the battery is equal to or less than a predetermined reference value; and
   resetting, by the controller, a power supply to each motor of the plurality of motors, based on the present current consumption of each motor of the plurality of motors.

2. The method according to claim 1, wherein an electric power is supplied to each motor of the plurality of motors by applying a driving voltage by a PWM (Pulse Width Modulation) method in which a duty is adjusted.

3. The method according to claim 1, wherein the calculating a present current consumption comprises setting a first priority for power supply between the plurality of motors, based on the present current consumption of each motor of the plurality of motors.

4. The method according to claim 3, wherein the resetting a power supply comprises assigning less power supply to a motor of which the present current consumption is less than the present current consumption of any motor of other motors of the plurality of motors.

5. The method according to claim 3, wherein the calculating a present current consumption further comprises setting a second priority based on a rating of each motor of the plurality of motors, after the setting a first priority.

6. The method according to claim 5, wherein the resetting a power supply further includes calculating an integrated priority based on the first priority and the second priority of each motor of the plurality of motors and comparing the integrated priorities of the plurality of motors, wherein a greater reduction rate of power is applied to a corresponding motor of which the integrated priority is lower than the integrated priority of any motor of other motors.

7. The method according to claim 6, wherein the resetting a power supply further includes, when motors having the same integrated priority exist, applying a greater reduction rate of power to a motor of which the first priority is low.

8. The method according to claim 5, wherein:
   each of the first priority and the second priority is set such that priority values of 1 to n are assigned from a motor having a highest priority in a sequential order; and
   the resetting a power supply, based on a result obtained by combining priority values according to the first priority and priority values according to the second priority, further includes applying a greater reduction rate of power to a corresponding motor of which a combined priority value is greater than a combined value of other motors,
   where n is a natural number corresponding to a number of motors of the plurality of motors.

9. The method according to claim 8, wherein the resetting a power supply further includes, when a same combined priority value is found in different motors, applying a greater reduction rate of power to a motor of which the priority value of the first priority is greater than the priority value of the first priority assigned to other motors of the plurality of motors.

10. A system for controlling motors, the system comprising:
   a battery;
   a plurality of motors driven by an electric power stored in the battery; and
   a controller configured to allow the electric power stored in the battery to be supplied to each motor of the plurality of motors according to a traveling state of a vehicle and to control a driving voltage applied to the plurality of motors,
   wherein when a state of charge of the battery is equal to or less than a predetermined reference value, the controller is configured to calculate a present current consumption of each motor of the plurality of motors, and reset a supply power to said each motor, based on the present current consumption of said each motor.

11. The system according to claim 10, wherein the controller is configured to set a first priority for power supply between the motors of the plurality of motors based on the present current consumption of each motor of the plurality of motors, and less power supply is assigned by the controller to a motor of which the present current consumption is less than the present current consumption of other motors of the plurality of motors.

12. The system according to claim 11, wherein the controller is configured to set a second priority based on a rating of each motor of the plurality of motors, and the controller is configured to calculate an integrated priority based on the first priority and the second priority and compare the integrated priorities, wherein a greater reduction rate of power supply is applied by the controller to a corresponding motor of which the integrated priority is lower than the integrated priority of other motors of the plurality of motors.

13. The system according to claim 12, wherein when motors having a same integrated priority exist, a greater reduction rate of power supply is applied by the controller to a motor of which the first priority is low.

14. The system according to claim 12, wherein each of the first priority and the second priority is set such that priority values of 1 to n are assigned from a motor having a highest priority in a sequential order by the controller, and the controller is configured to combine priority values according to the first priority and priority values according to the second priority, and apply a greater reduction rate of power supply to a corresponding motor of which a combined priority value is greater than a combined value of other motors of the plurality of motors, where n is a natural number corresponding to a number of motors of the plurality of motors.

15. The system according to claim 14, wherein when a same combined priority value is found in different motors, the controller is configured to apply a greater reduction rate of power supply to a corresponding motor of which the priority value of the first priority is greater than the priority value of the first priority assigned to other motors of the plurality of motors.

* * * * *